(12) United States Patent
Liao et al.

(10) Patent No.: US 12,501,717 B2
(45) Date of Patent: Dec. 16, 2025

(54) SEMICONDUCTOR STRUCTURE WITH A GATE AND A SHIELDING STRUCTURE

(71) Applicant: Vanguard International Semiconductor Corporation, Hsinchu (TW)

(72) Inventors: Hsien-Feng Liao, Taichung (TW); Jian-Hsing Lee, Hsinchu (TW); Chieh-Yao Chuang, Kaohsiung (TW); Ting-Yu Chang, Zhubei (TW); Yeh-Ning Jou, Hsinchu (TW); Shao-Chang Huang, Hsinchu (TW); Kan-Sen Chen, Zhubei (TW); Nai-Lun Cheng, Zhubei (TW); Ching-Yi Hsu, Hsinchu (TW); Yu-Chen Wu, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 65 days.

(21) Appl. No.: 17/826,736

(22) Filed: May 27, 2022

(65) Prior Publication Data

US 2023/0387103 A1 Nov. 30, 2023

(51) Int. Cl.
*H10D 89/60* (2025.01)
(52) U.S. Cl.
CPC ................................. *H10D 89/814* (2025.01)
(58) Field of Classification Search
CPC .................................................. H01L 27/0274
USPC ............................................................ 257/355
See application file for complete search history.

(56) References Cited

U.S. PATENT DOCUMENTS

| 4,805,138 | A | * | 2/1989 | McElroy | ................ | G11C 16/18 |
| | | | | | | 257/659 |
| 4,970,565 | A | * | 11/1990 | Wu | ........................ | G11C 16/18 |
| | | | | | | 257/318 |
| 2007/0057280 | A1 | * | 3/2007 | Hayashi | .............. | H01L 29/7833 |
| | | | | | | 257/E29.267 |
| 2008/0001189 | A1 | * | 1/2008 | Jong | ................... | H01L 29/0692 |
| | | | | | | 257/288 |
| 2008/0179624 | A1 | * | 7/2008 | Russ | .................... | H10D 18/251 |
| | | | | | | 257/E29.183 |

(Continued)

OTHER PUBLICATIONS

Taiwanese Office Action and Search Report for Taiwanese Application No. 111108686, dated Sep. 5, 2022.

*Primary Examiner* — Sheng-Bai Zhu
(74) *Attorney, Agent, or Firm* — Birch, Stewart, Kolasch & Birch, LLP

(57) ABSTRACT

A semiconductor structure is provided. At least one first well region is disposed in a semiconductor substrate and has a first conductivity type. At least one gate of a transistor is disposed over the first well region and extends in a first direction. At least one second well region and at least one third well region are disposed on opposite sides of the first well region and extend in the first direction. The second and third well regions have a second conductivity type. A first shielding structure is disposed on at least one end of the gate and partially overlaps the first well region in a vertical projection direction. The first shielding structure is separated from the end of the gate. A bulk ring is disposed in the semiconductor substrate and surrounds the gate, the second well region, the third well region, and the first shielding structure.

17 Claims, 16 Drawing Sheets

(56) References Cited

U.S. PATENT DOCUMENTS

| | | | |
|---|---|---|---|
| 2008/0203444 A1* | 8/2008 | Kim | H01L 29/42316 |
| | | | 257/E29.127 |
| 2009/0309169 A1* | 12/2009 | Wu | H01L 27/088 |
| | | | 257/E27.06 |
| 2010/0155837 A1* | 6/2010 | Hebert | H01L 21/823437 |
| | | | 257/334 |
| 2010/0171149 A1* | 7/2010 | Denison | H01L 27/0262 |
| | | | 257/173 |
| 2010/0327841 A1* | 12/2010 | Ito | G11C 5/147 |
| | | | 323/313 |
| 2013/0146978 A1* | 6/2013 | Mahalingam | H01L 27/0259 |
| | | | 257/355 |
| 2017/0115775 A1* | 4/2017 | Wu | H01L 27/0292 |
| 2017/0323880 A1* | 11/2017 | Tai | H01L 27/0277 |
| 2020/0083343 A1* | 3/2020 | Chen | H01L 29/4916 |

\* cited by examiner

SEMICONDUCTOR STRUCTURE WITH A GATE AND A SHIELDING STRUCTURE

BACKGROUND OF THE INVENTION

Field of the Invention

The invention relates to a semiconductor structure, and more particularly to a semiconductor structure with shielding structures.

Description of the Related Art

The electronics industry has experienced an increased demand for smaller and faster electronic devices that simultaneously support a larger number of increasingly complex and high-tech functions. Therefore, a continuing trend in the semiconductor industry is to fabricate integrated circuits (ICs) that are low cost, high performance, and low power.

Today, ICs include millions or billions of semiconductor devices formed on a semiconductor substrate (such as silicon). ICs may use many different types of semiconductor structure devices depending on the application of the ICs. In recent years, the increased market for cellular devices and radio frequency (RF) devices has led to a significant increase in the use of high voltage semiconductor structural devices. For example, high voltage semiconductor structures are commonly used in power amplifiers in RF transmitter/receivers due to their ability to handle high breakdown voltages and high frequencies. In addition, high voltage semiconductor devices can also be used in electrostatic discharge (ESD) protection circuits.

BRIEF SUMMARY OF THE INVENTION

Semiconductor structures are provided. An embodiment of a semiconductor structure is provided. The semiconductor structure includes a semiconductor substrate, at least one first well region, at least one gate of a transistor, at least one second well region and at least one third well region, a first shielding structure, and a bulk ring. The at least one first well region is disposed in the semiconductor substrate and has a first conductivity type. The at least one gate is disposed over the at least one first well region and extends in the first direction. The at least one second well region and the at least one third well region are disposed on opposite sides of the at least one first well region and extend in the first direction. The at least one second well region and the at least one third well region have a second conductivity type, wherein the second conductivity type is complementary to the first conductivity type. The first shielding structure is disposed on at least one end of the at least one gate and partially overlaps the at least one first well region in a vertical projection direction. The first shielding structure is separated from the at least one end of the at least one gate. The bulk ring is disposed in the semiconductor substrate and surrounds the at least one gate, the at least one second well region, the at least one third well region, and the first shielding structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1A:
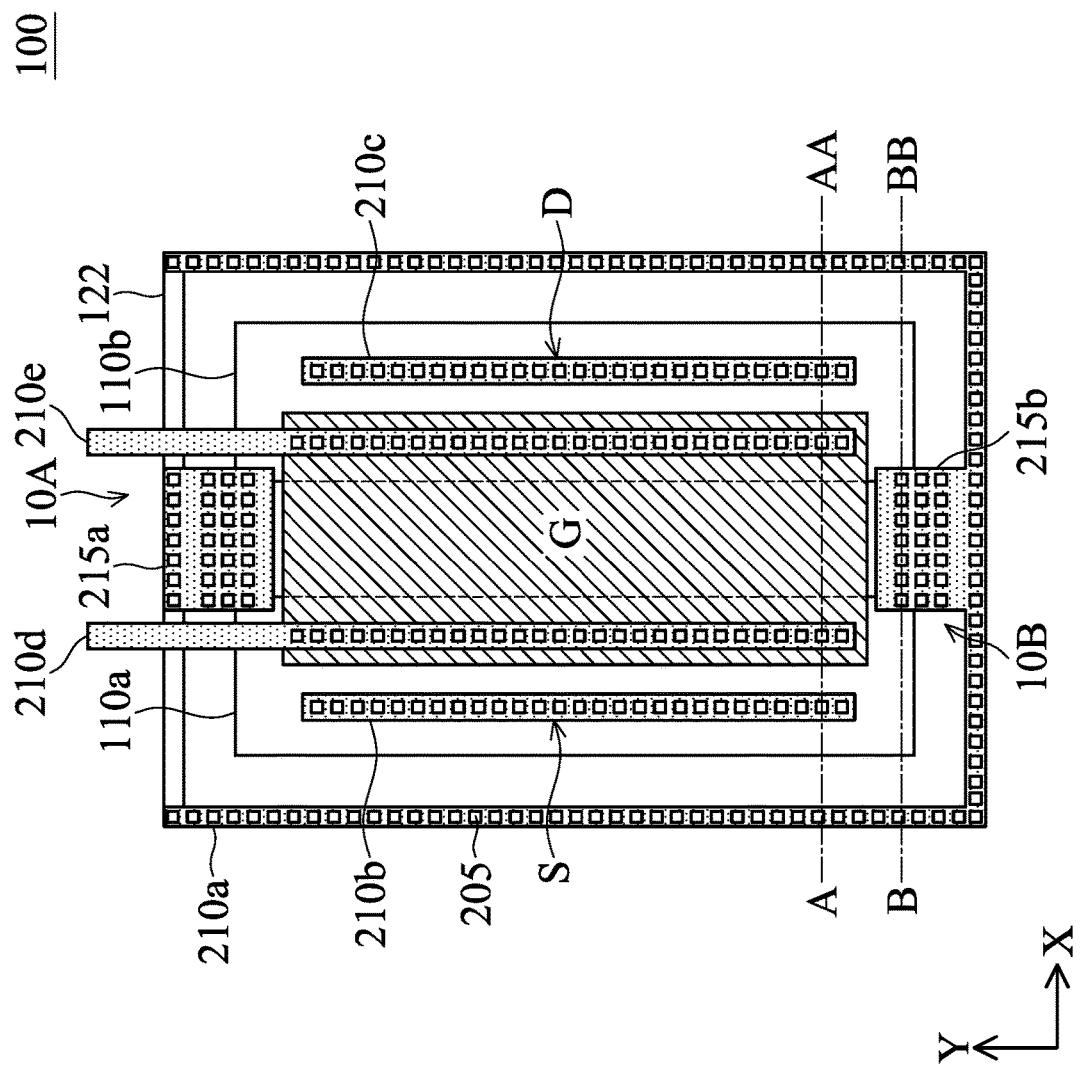
FIG. 1A shows a top view of a semiconductor structure according to some embodiments of the invention.

The following description is of the best-contemplated mode of carrying out the invention. This description is made for the purpose of illustrating the general principles of the invention and should not be taken in a limiting sense. The scope of the invention is best determined by reference to the appended claims.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a top view of a semiconductor structure 100 according to some embodiments of the invention. In some embodiments, the semiconductor structure 100 is an N-type symmetric semiconductor structure. In some embodiments, the semiconductor structure 100 is a high voltage semiconductor structure. In such embodiment, the semiconductor structure 100 includes a transistor, and the bulk region B of the transistor forms a ring, hereinafter referred to as the bulk ring 122. The bulk ring 122 is electrically coupled to the upper interconnect structure (not shown) through the contacts 205 and the metal lines 210a. In some embodiments, the gate G of the transistor in the semiconductor structure 100 includes a metal gate structure. In addition, the gate G is electrically coupled to the upper interconnect structure (not shown) through the contacts 205 and the metal lines 210d and 210e. The source region S of the transistor in the semiconductor structure 100 is formed in the second well region 110a, and is electrically coupled to the upper interconnect structure (not shown) through the contacts 205 and the metal line 210b. Furthermore, the drain region D of the transistor in the semiconductor structure 100 is formed in the third well region 110b, and is electrically coupled to the upper interconnect structure (not shown) through the contacts 205 and the metal line 210c. In such embodiment, the metal line 210a partially overlaps the bulk ring 122. In addition, the metal lines 210b, 210c, 210d and 210e extend in the Y direction, and the metal lines 210d and 210 span a part of the bulk ring 122 (i.e., the part not covered by the metal line 210a).

In FIG. 1A, the semiconductor structure 100 further includes the shielding structures 10A and 10B. In such embodiment, the bulk ring 122 is a square ring. The shielding structures 10A and 10B are formed between the gate G and the bulk ring 122. For example, in the layout, the shielding structure 10A is formed between the gate G and a first side (or the first edge) of the bulk ring 122, and the shielding structure 10B is formed between the gate G and the second side (or the second edge) of the bulk ring 122. For the bulk ring 122, the first side is opposite to the second side. Similarly, the shielding structure 10A is disposed close to one end (e.g., the upper end) of the gate G, and the shielding structure 10B is disposed close to the other end (e.g., the lower end) of the gate G. For the gate G, the shielding structures 10A and 10B are disposed at opposite ends of the gate G. In such embodiment, the shielding structure 10A is further disposed between the metal lines 210d and 210e. The shielding structures 10A and 10B are formed by polysilicon. In some embodiments, the shielding structure 10A further includes the electrode (or metal plate) 215a and the contacts 205, and the shielding structure 10B further includes the electrode (or metal plate) 215b and the contacts 205. In the top view of the semiconductor structure in FIG. 1A, the gate G extends in the Y direction. In some embodiments, the gate G is formed of polysilicon. In some embodiments, the gate G is formed of metal. The drain region D and the source region S are disposed on the left and right sides of the gate electrode G. and the shielding structures 10A and 10B are formed on the upper and lower sides of the gate electrode G. In other words, the gate G and the shielding structures 10A and 10B are arranged along the same straight line in the Y direction.

In the semiconductor structure 100, the metal lines 210a-210e and the metal plates 215a and 215b are formed of the same conductive material. Furthermore, the metal lines 210a-210e and the metal plates 215a and 215b are formed in the same metal layer (e.g., the lowest metal layer). In addition, the metal plate 215b is connected to the metal line 210a on the second side of the bulk ring 122.

Figure 1B:
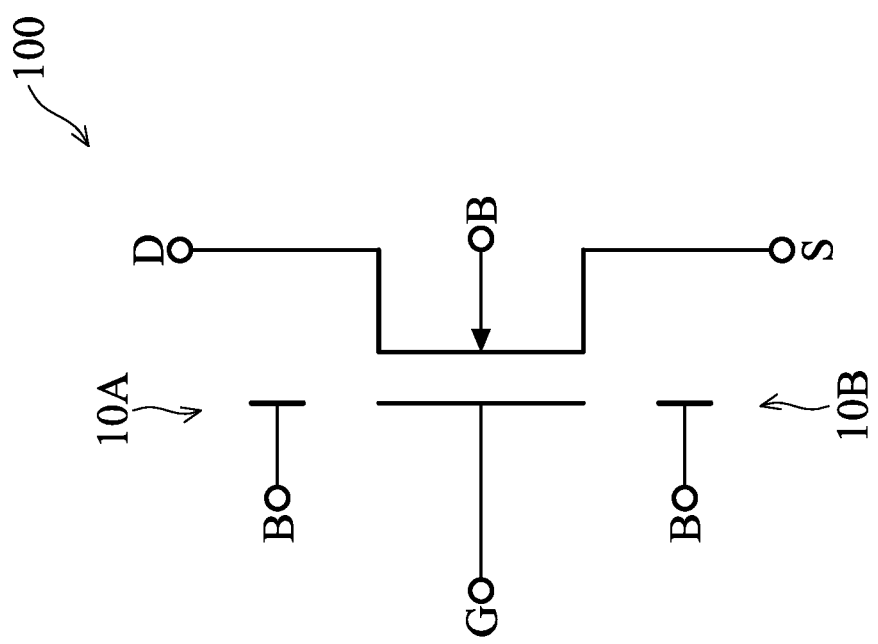
FIG. 1B shows a symbol of the semiconductor structure in FIG. 1A.

FIG. 1B shows a symbol of the semiconductor structure 100 in FIG. 1A. In FIG. 1B, the gate G, the drain region, the source region S and the bulk region B of the semiconductor structure 100 have respective terminals, i.e., the semiconductor structure 100 have four terminals. As described above, the shielding structures 10A and 10B are arranged on opposite sides of the gate G. Furthermore, the shielding structures 10A and 10B are connected to the bulk region B (i.e., the bulk ring 122).

Figure 1C:
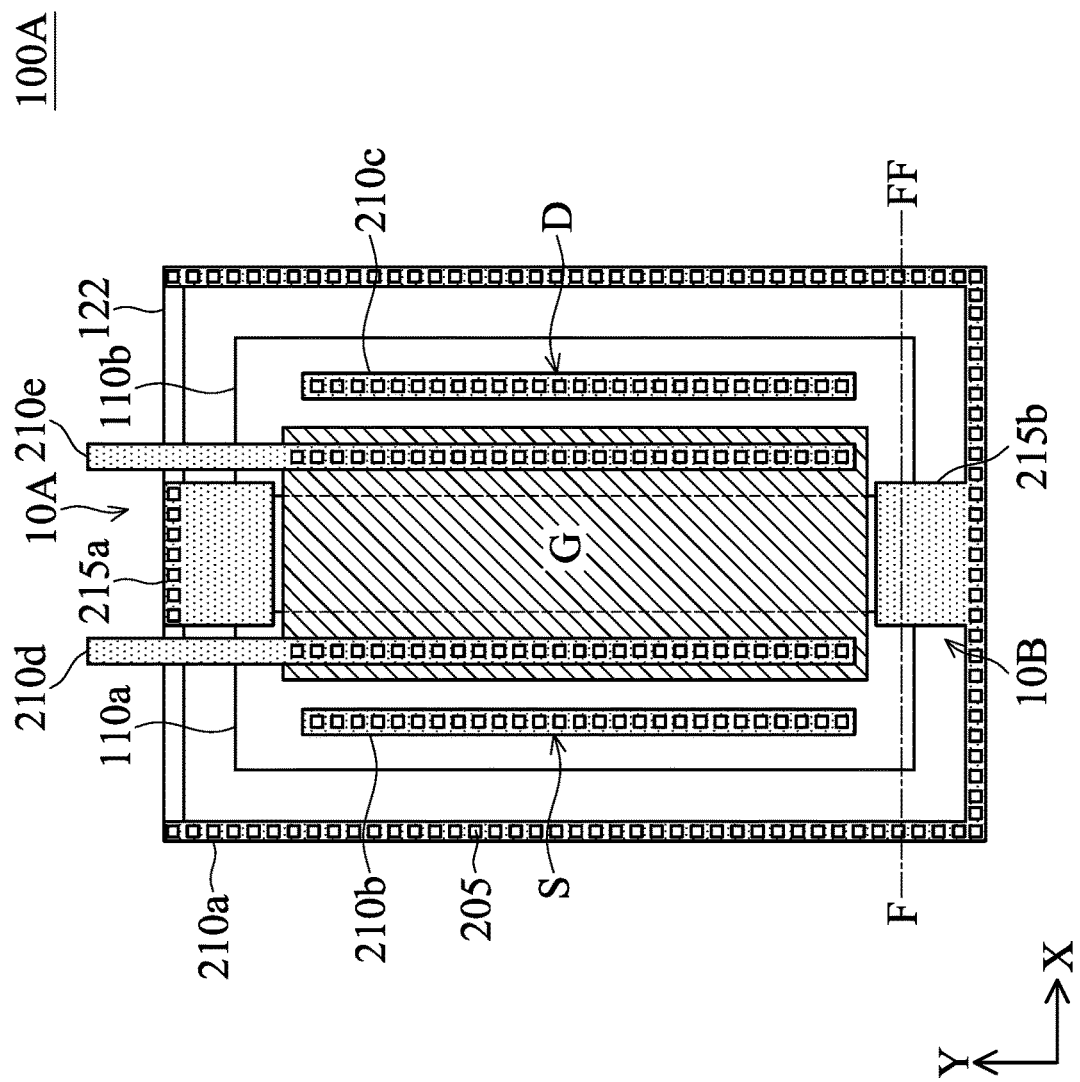
FIG. 1C shows a top view of a semiconductor structure according to some embodiments of the invention.

FIG. 1C shows a top view of a semiconductor structure 100A according to some embodiments of the invention. In some embodiments, the semiconductor structure 100A is an N-type symmetric semiconductor structure. In some embodiments, the semiconductor structure 100A is a high voltage semiconductor structure. In such embodiment, the semiconductor structure 100A includes a transistor with four terminals (as shown in FIG. 1B).

The structure of the semiconductor structure 100A is similar to that of the semiconductor structure 100 in FIG. 1A. The difference from the semiconductor structure 100 in FIG. 1A is that the shielding structures 10A and 10B of the semiconductor structure 100A in FIG. 1C are formed by the electrodes (or metal plate) 215a and 215b, respectively. In other words, the shielding structures 10A and 10B of the semiconductor structure 100A do not include the polysilicon. Compared with the semiconductor structure 100 in FIG. 1A, the electrodes (or metal plate) 215a and 215b of the semiconductor structure 100A in FIG. 1C have fewer contacts 205, i.e., no contacts 205 are arranged between the bulk ring 122 and the gate G for the electrodes (or metal plate) 215a and 215b. The contacts corresponding to the metal plates 215a and 215b are only configured to connect to the bulk ring 122.

Figure 2:
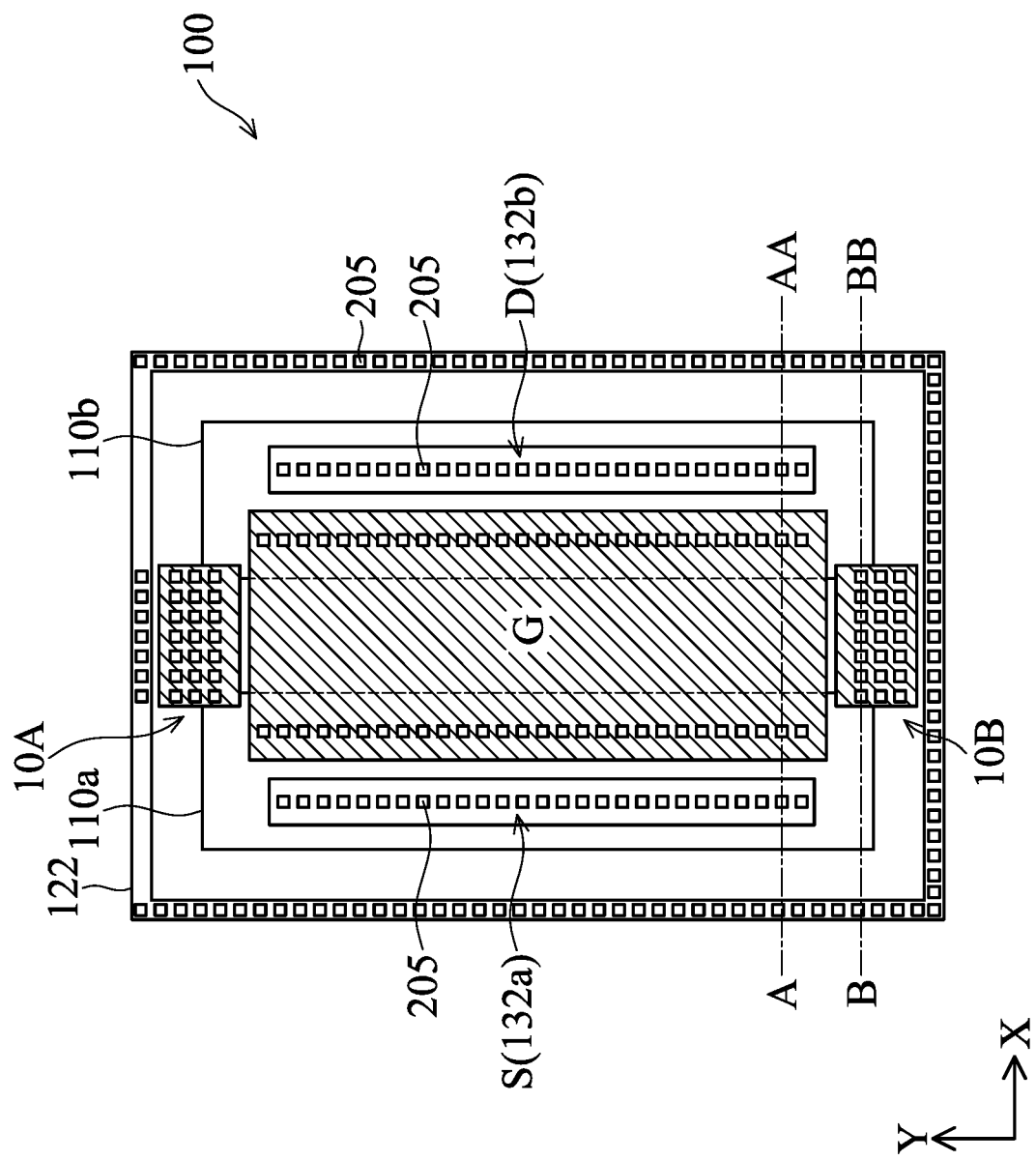
FIG. 2 shows a top view of the semiconductor structure in FIG. 1A with the metal lines and metal plates removed in accordance with some embodiments of the invention.

FIG. 2 shows a top view of the semiconductor structure 100 in FIG. 1A with the metal lines 210a-210e and metal plates 215a and 215b removed in accordance with some embodiments of the invention. Referring to FIG. 1A and FIG. 2 simultaneously, a first doped region 132a is formed in the second well region 110a, and the metal line 210b is electrically coupled to the source region S of the transistor through the contacts 205 and the first doped region 132a. In addition, the N-type doped region 132b is formed in the third well region 110b, and the metal line 210c is electrically coupled to the drain region D of the transistor through the contacts 205 and the first doped region 132b. The first doped regions 132a and 132b extend in the Y direction. In some embodiments, the first doped regions 132a and 132b are N-type doped regions.

In one embodiment, the shielding structure 10A is polysilicon, and the shielding structure 10A is electrically coupled to the metal plate 215a through the contacts 205. The shielding structure 10A is separated from the gate G and the bulk ring 122, and partially overlaps the second well region 110a and the third well region 110b. In addition, the shielding structure 10A is electrically connected to the bulk ring 122 through the metal plate 215a and the contacts 205. Similarly, the shielding structure 10B is polysilicon in one embodiment, and the shielding structure 10B is electrically coupled to the metal plate 215b through the contacts 205. The shielding structure 10B is separated from the gate G and the bulk ring 122, and partially overlaps the second well region 110a and the third well region 110b. Moreover, the shielding structure 10B is electrically connected to the bulk ring 122 through the metal plate 215b and the contacts 205.

In some embodiments, the gate electrode G and the shielding structures 10A and 10B are disposed in the same layer and formed of the same polysilicon material, but the present invention is not limited thereto. In some embodiments, the gate G and the shielding structures 10A and 10B are formed of different materials, respectively. The gate G includes a polysilicon, metal, or is formed of other suitable materials. The shielding structures 10A and 10B include polysilicon, metal, or are formed from other suitable materials. The width of the shielding structures 10A and 10B is less than the width (or dimension) of the gate electrode G in the X direction. In the Y direction, the lengths of the shielding structures 10A and 10B are also less than the length (or dimension) of the gate G. Specifically, the area of the shielding structure 10A or 10B is smaller than the area of the gate electrode G, so as to achieve a better area utilization rate and facilitate the reduction of the semiconductor device.

Figure 3:
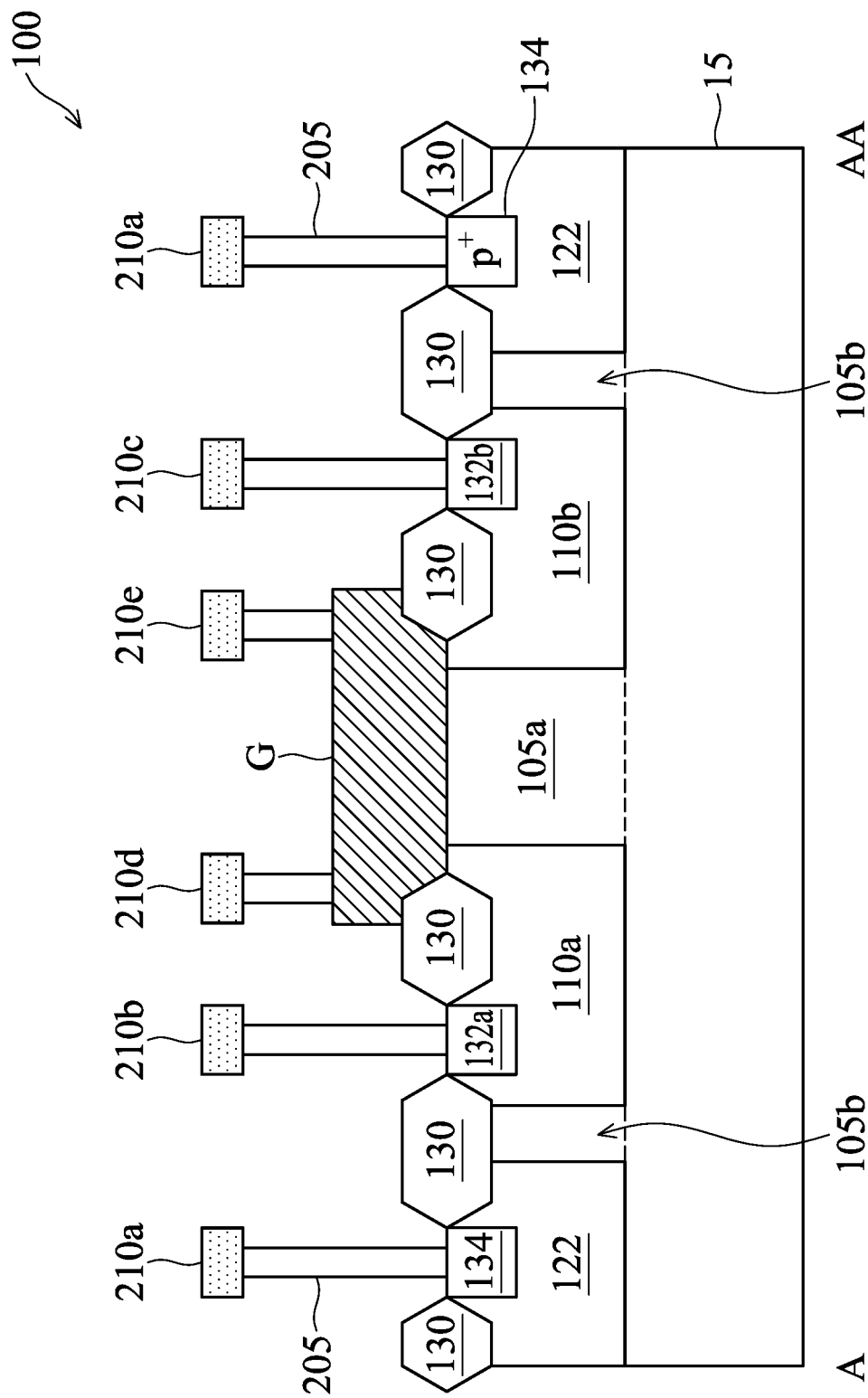
FIG. 3 shows a cross-sectional view of the semiconductor structure in FIGS. 1A and 2 along line A-AA according to some embodiments of the invention.

FIG. 3 shows a cross-sectional view of the semiconductor structure 100 in FIGS. 1A and 2 along line A-AA according to some embodiments of the invention. The second well region 110a and the third well region 110b are formed in the semiconductor substrate 15. In some embodiments, the semiconductor substrate 15 may be a bulk silicon substrate, a silicon-on-insulator substrate, a binary compound semiconductor substrate, a ternary compound semiconductor substrate, or a higher order compound semiconductor substrate, or the like. The second well region 110a and the third well region 110b are formed by implanting one or more dopants or ion implantation processes.

In the semiconductor structure 100, the source region S is formed by the second well region 110a, and the second well region 110a is electrically coupled to the metal line 210b through the first doped region 132a and the contacts 205 in sequence. In addition, the drain region D in the semiconductor structure 100 is formed by the third well region 110b, and the third well region 110b is electrically coupled to the metal line 210c through the first doped region 132b and the contacts 205 in sequence.

The bulk ring 122, the first well region 105a, and the seventh well region 105b are formed in the semiconductor substrate 15. The first well region 105a is formed between the second well region 110a and the third well region 110b, and the seventh well region 105b is formed between the second well region 110a and the third well region 110b and the bulk ring 122. In some embodiments, the first well region 105a and the seventh well region 105b are P-type well regions, and the second well region 110a and the third well region 110b are N-type well regions. In some embodiments, the first well region 105a and the seventh well region 105b may be the semiconductor substrate 15. In some embodiments, the first well region 105a and the seventh well region 105b and the bulk ring 122 are formed of the same material. Moreover, the channel of the transistor in the semiconductor structure 100 is formed in the first well region 105a. The bulk ring 122 is formed by a P-type well region. The second doped region 134 is formed in the bulk ring 122, and the metal line 210a is electrically coupled to the bulk ring 122 through the contacts 205 and the second doped region 134. In some embodiments, the second doped region 134 is a P-type heavy doped region.

The second well region 110a and the third well region 110b and the bulk ring 122 are separated by the first well region 105a. Furthermore, the first doped region 132a and the second doped region 134 are separated by the field oxide 130, and the first doped region 132b and the second doped region 134 are separated by the field oxide 130. The gate electrode G is formed over the first well region 105a. In order to simplify the description, other features of the gate G in the semiconductor structure 100 (e.g., the gate dielectric layer, etc.) will be omitted. In addition, the gate electrode G is electrically coupled to the metal lines 210d and 210e through the contacts 205. Furthermore, the gate G and the first doped regions 132a and 132b are separated by the field oxide 130.

Figure 4A:
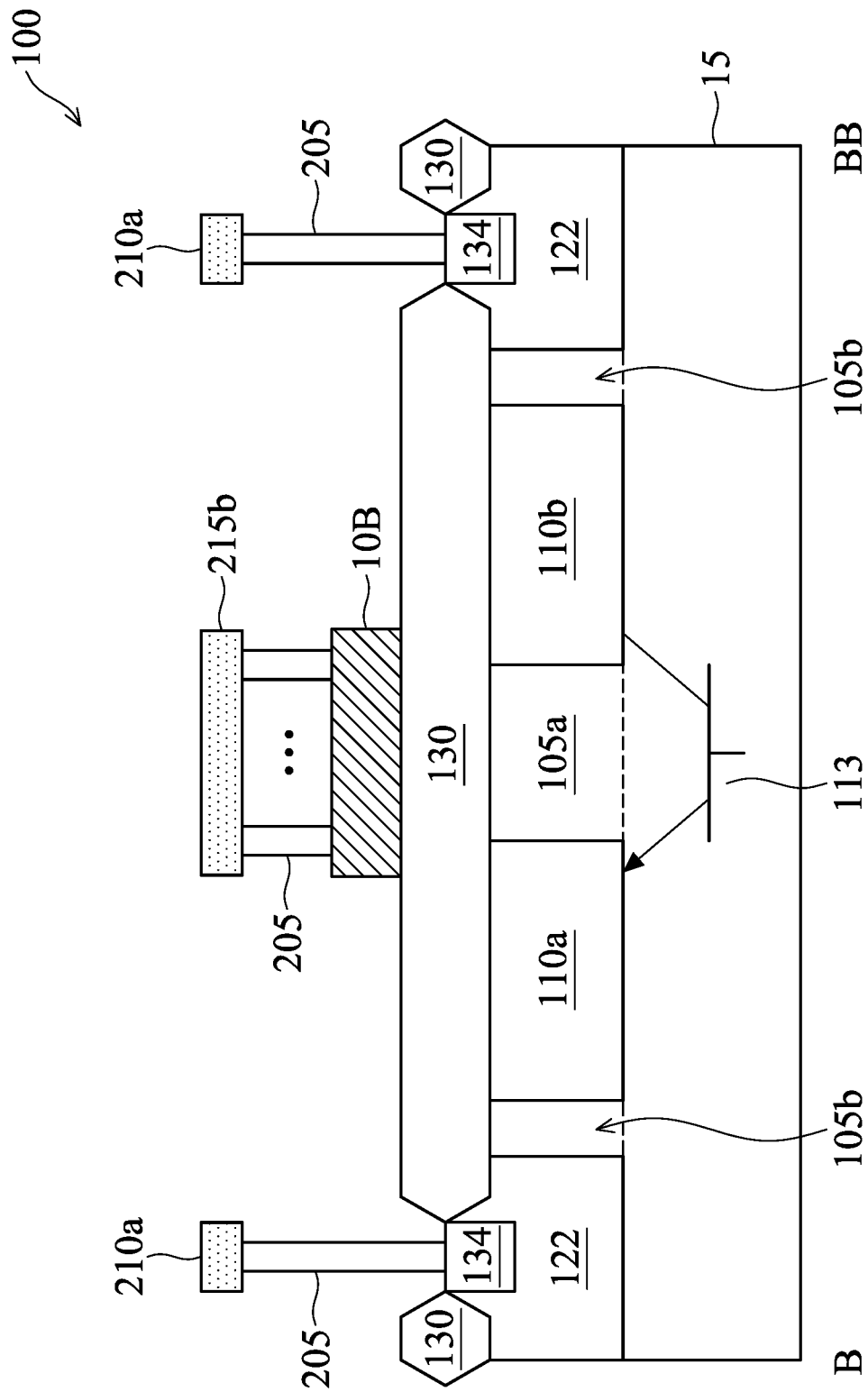
FIG. 4A shows a cross-sectional view of the semiconductor structure in FIGS. 1A and 2 along the line B-BB according to some embodiments of the invention.

FIG. 4A shows a cross-sectional view of the semiconductor structure 100 in FIGS. 1A and 2 along the line B-BB according to some embodiments of the invention. The second well region 110a and the third well region 110b, the bulk ring 122, the first well region 105a, and the seventh well region 105b are formed in the semiconductor substrate 15. The shielding structure 10B is formed on the first well region 105a, and is separated from the first well region 105a and the second well region 110a and the third well region 110b by the field oxide 130. As shown in FIGS. 2 and 4, the shielding structures 10A and 10B partially overlap the first well region 105a and the second well region 110a and the third well region 110b in the vertical projection direction. As previously described, the shielding structure 10B is electrically coupled to the bulk ring 122 through the contacts 205, the metal plate 215b, the metal line 210a, the contacts 205 and the second doped region 134 in sequence. Therefore, when the bulk ring 122 is grounded through the interconnect structure in the semiconductor structure 100, the shielding structure 10B will be grounded. Thus, when the metal lines formed by the higher metal layers are disposed (routed) over the first well region 105a and the second well region 110a and the third well region 110b, the shielding structure 10B can avoid the voltage (e.g., the drain voltage to be supplied to the semiconductor structure 100) of the higher metal layer is coupled to the first well region 105a. Therefore, the parasitic NPN bipolar transistor (NPN BJT) 113 formed by the second well region 110a, the first well region 105a and the third well region 110b will not be turned on, so no leakage current will be generated. In addition, the leakage current generated by the gate bias voltage of the semiconductor structure 100 at high temperature can also be suppressed, thereby increasing the breakdown voltage.

Figure 4B:
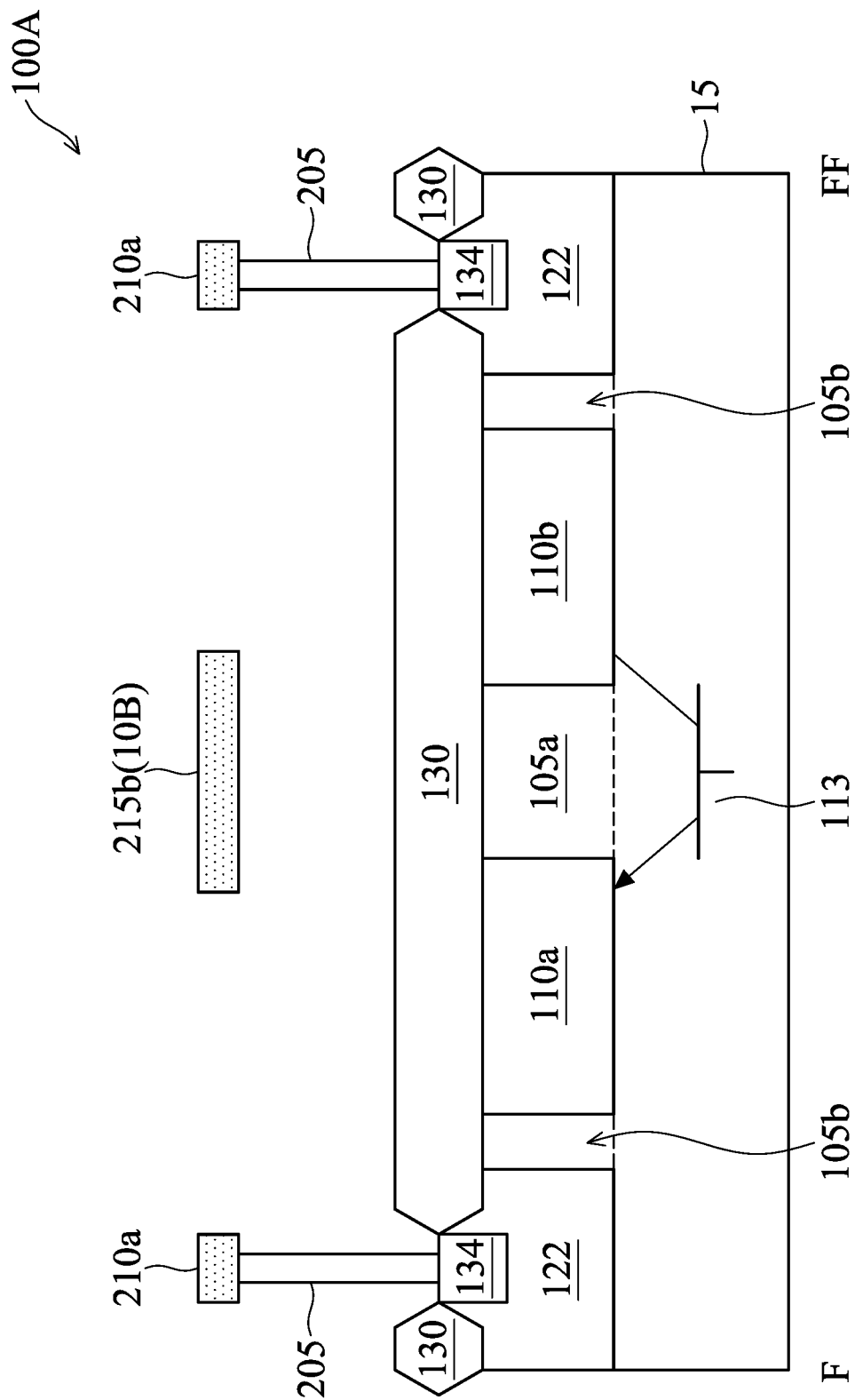
FIG. 4B shows a cross-sectional view of the semiconductor structure in FIG. 1C along the line F-FF according to some embodiments of the invention.

FIG. 4B shows a cross-sectional view of the semiconductor structure 100A in FIG. 1C along the line F-FF according to some embodiments of the invention. The second well region 110a and the third well region 110b, the bulk ring 122, the first well region 105a, and the seventh well region 105b are formed in the semiconductor substrate 15. In the semiconductor structure 100A, the shielding structure 10B is formed by the metal plate 215a. Compared with the semiconductor structure 100 of FIG. 4A, no contacts 205 and polysilicon are formed between the metal plate 215a and the first well region 105a. Moreover, the shielding structures 10A and 10B partially overlap the first well region 105a and the second well region 110a and the third well region 110b in the vertical projection direction. As previously described, the shielding structure 10B is electrically coupled to the bulk ring 122 through the metal line 210a, the contacts 205 and the second doped region 134 in sequence. Therefore, when the bulk ring 122 is grounded through the interconnect structure in the semiconductor structure 100A, the shielding structure 10B will be grounded. Thus, when the metal lines formed by the higher metal layers are disposed (routed) over the first well region 105a and the second well region 110a and the third well region 110b, the shielding structure 10B can avoid the voltage (e.g., the drain voltage to be supplied to the semiconductor structure 100) of the higher metal layer is coupled to the first well region 105a. Therefore, the parasitic NPN bipolar transistor (NPN BJT) 113 formed by the second well region 110a, the first well region 105a and the third well region 110b will not be turned on, so no leakage current will be generated. In addition, the leakage current generated by the gate bias voltage of the semiconductor structure 100A at high temperature can also be suppressed, thereby increasing the breakdown voltage.

Figure 5:
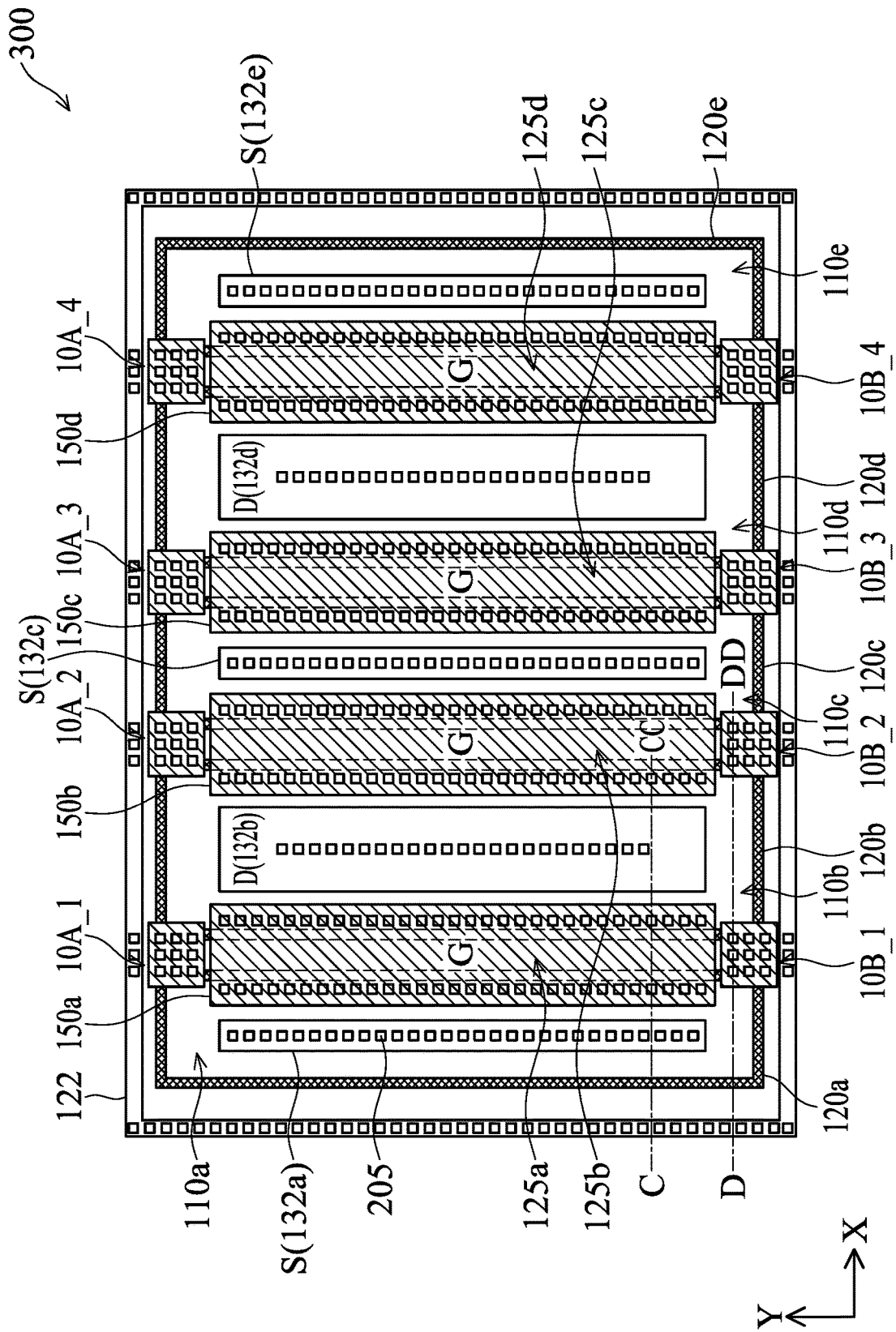
FIG. 5 shows a top view of a semiconductor structure according to some embodiments of the invention.

FIG. 5 shows a top view of a semiconductor structure 300 according to some embodiments of the invention. In some embodiments, the semiconductor structure 300 is an N-type symmetric semiconductor structure. In some embodiments, the semiconductor structure 300 is a high voltage semiconductor structure. In such embodiment, the semiconductor structure 300 includes a transistor with four terminals (as shown in FIG. 1B), and the bulk region of the transistor forms a ring, hereinafter referred to as the bulk ring 122. The gate G of the transistor in the semiconductor structure 300 is formed by a plurality of sub-gates 150a-150d. In some embodiments, the sub-gates 150a-150d are electrically coupled to the same finger electrode (not shown) on the upper layer through the contacts 205. The source region S of the transistor in the semiconductor structure 300 is formed in the second well region 110a, the fourth well region 110c, and the sixth well region 110e, and is electrically coupled to the upper interconnect structure (not shown) through the first doped regions 132a, 132c and 132e and the contacts 205. The drain region D of the transistor in the semiconductor structure 300 is formed in the third well region 110b and the fifth well region 110d, and is electrically coupled to the upper interconnect structure (not shown) through the first doped regions 132b and 132d and the contacts 205. In such embodiment, in order to simplify the description, electrodes and metal lines in the lowest metal layer for electrically coupling various features of the semiconductor structure 300 will be omitted. Furthermore, the second well region 110a, the fourth well region 110c, and the sixth well region 110e and the third well region 110b and the fifth well region 110d are alternately arranged along the X direction, that is, the drain regions D and the source regions S are alternately arranged along the X direction.

In such embodiment, the sub-gate 150a is disposed between the first doped regions 132a and 132b and over the first well region 125a. The sub-gate 150b is disposed between the first doped regions 132b and 132c and over the first well region 125b. The sub-gate 150c is disposed between the first doped regions 132c and 132d and over the first well region 125c. The sub-gate 150d is disposed between the first doped regions 132d and 132e and over the first well region 125d. The first well regions 125a-125d may be P-type well regions. In addition, the second well region 110a, the third well region 110b, the fourth well region 110c, the fifth well region 110d, and the sixth well region 110e are surrounded by the ring-shaped well regions 120a-120e, respectively. For example, the second well region 110a is completely surrounded by the ring-shaped well region 120a, and the third well region 110b is completely surrounded by the ring-shaped well region 120b. In some embodiments, the ring-shaped well regions 120a-120e may be formed by P-type well regions. In some embodiments, the ring-shaped well regions 120a-120e may be formed by a P-type substrate.

In FIG. 5, the semiconductor structure 300 includes the shielding structures 10A_1-10A_4 and 10B_1-10B_4. In such embodiment, the bulk ring 122 is a square ring. The shielding structures 10A_1-10A_4 are formed near a first side of the bulk ring 122, and the shielding structures 10B_1-10B_4 are formed near a second side of the bulk ring 122. As previously described, the shielding structures 10A_1-10A_4 and the shielding structures 10B_1-10B_4 are formed of polysilicon. The shielding structures 10A_1-10A_4 and the shielding structures 10B_1-10B_4 are electrically coupled to the bulk ring 122 through the contacts 205 and the upper metal plates (e.g., the electrodes 215a and 215b in FIG. 1).

Furthermore, the sub-gate 150a and the shielding structures 10A_1 and 10B_1 are disposed along the same straight line in the Y direction. The sub-gate 150b and the shielding structures 10A_2 and 10B_2 are disposed along the same straight line in the Y direction. The sub-gate 150c and the shielding structures 10A_3 and 10B_3 are arranged along the same straight line in the Y direction. The sub-gate 150d and the shielding structures 10A_4 and 10B_4 are disposed along the same straight line in the Y direction.

Figure 6:
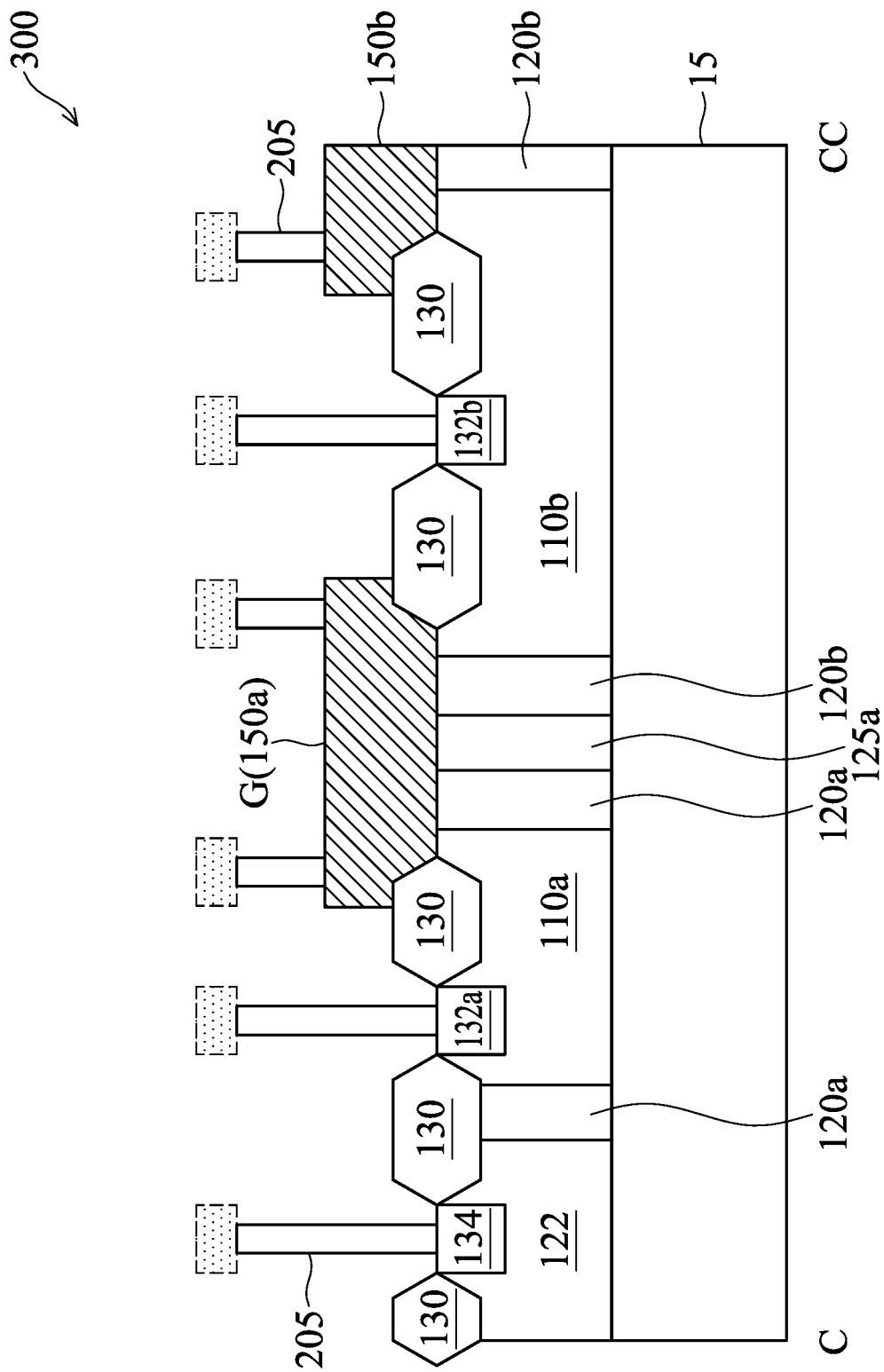
FIG. 6 shows a cross-sectional view of the semiconductor structure in FIG. 5 along the line C-CC according to some embodiments of the invention.

FIG. 6 shows a cross-sectional view of the semiconductor structure 300 in FIG. 5 along the line C-CC according to some embodiments of the invention. The second well region 110a and the third well region 110b are formed in the semiconductor substrate 15. The second well region 110a forms the source region S of the semiconductor structure 300, and the second well region 110a is electrically coupled to the upper metal line through the first doped region 132a and the contacts 205. Moreover, the second well region the third well region 110b forms the drain region D of the semiconductor structure 300, and the second well region the third well region 110b is electrically coupled to the upper metal line through the first doped region 132b and the contacts 205.

As previously described, the second well region 110a is surrounded by the ring-shaped well region 120a, and the second well region the third well region 110b is surrounded by the ring-shaped well region 120b. The first well region 125a is formed in the semiconductor substrate 15 and between the ring-shaped well regions 120a and 120b. The sub-gate 150a is formed over the second well region 110a, the ring-shaped well region 120a, the first well region 125a, the ring-shaped well region 120b, and the second well region the third well region 110b. In addition, the sub-gate 150a is electrically coupled to an upper metal line (e.g., a finger electrode) through the contacts 205. It should be noted that the sub-gate 150a completely overlaps the first well region 125a.

Figure 7:
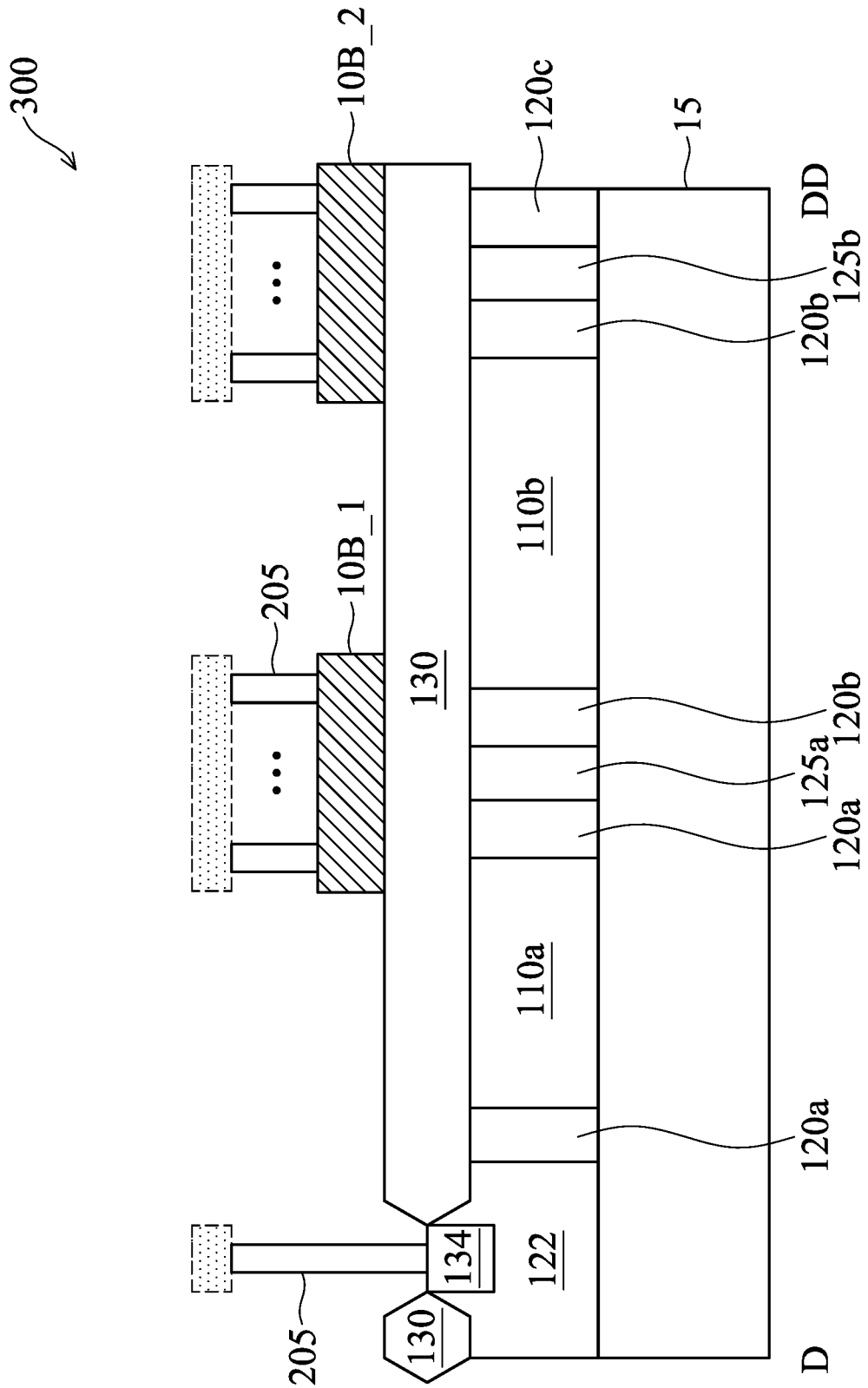
FIG. 7 shows a cross-sectional view of the semiconductor structure in FIG. 5 along the line D-DD according to some embodiments of the invention.

FIG. 7 shows a cross-sectional view of the semiconductor structure 300 in FIG. 5 along the line D-DD according to some embodiments of the invention. The second well regions region 110a and the third well region 110b and the bulk ring 122 are formed in the semiconductor substrate 15. The shielding structure 10B_1 is formed on the first well region 125a and separated from the first well region 125a and the ring-shaped well regions 120a and 120b by the field oxide 130. The shielding structure 10B_2 is formed on the first well region 125b and separated from the first well region 125b and the ring-shaped well regions 120b and 120c by the field oxide 130. As previously described, the shielding structures 10B_1 and 10B_2 are electrically coupled to the bulk ring 122 through the contacts 205, the upper metal plates and metal lines, the contacts 205 and the second doped region 134. Therefore, when the bulk ring 122 is grounded through the interconnect structure in the semiconductor structure, the shielding structures 10A_1-10A_4 and the shielding structures 10B_1-10B_4 are grounded. Thus, when the metal lines formed by a higher metal layer are formed (routed) over the first well regions 125$a$ and 125$b$, the shielding structures 10B_1 and 10B_2 can avoid the voltage of the metal line (e.g., the drain voltage to be supplied to the semiconductor structure 300) is coupled to the first well regions 125$a$ and 125$b$. Therefore, the parasitic NPN type bipolar transistor (e.g., the bipolar transistor 113 in FIG. 4) formed by the second well region 110$a$, the first well region 125$a$, and the third well region 110$b$ will not be turned on, so no leakage current is generated.

Figure 8:
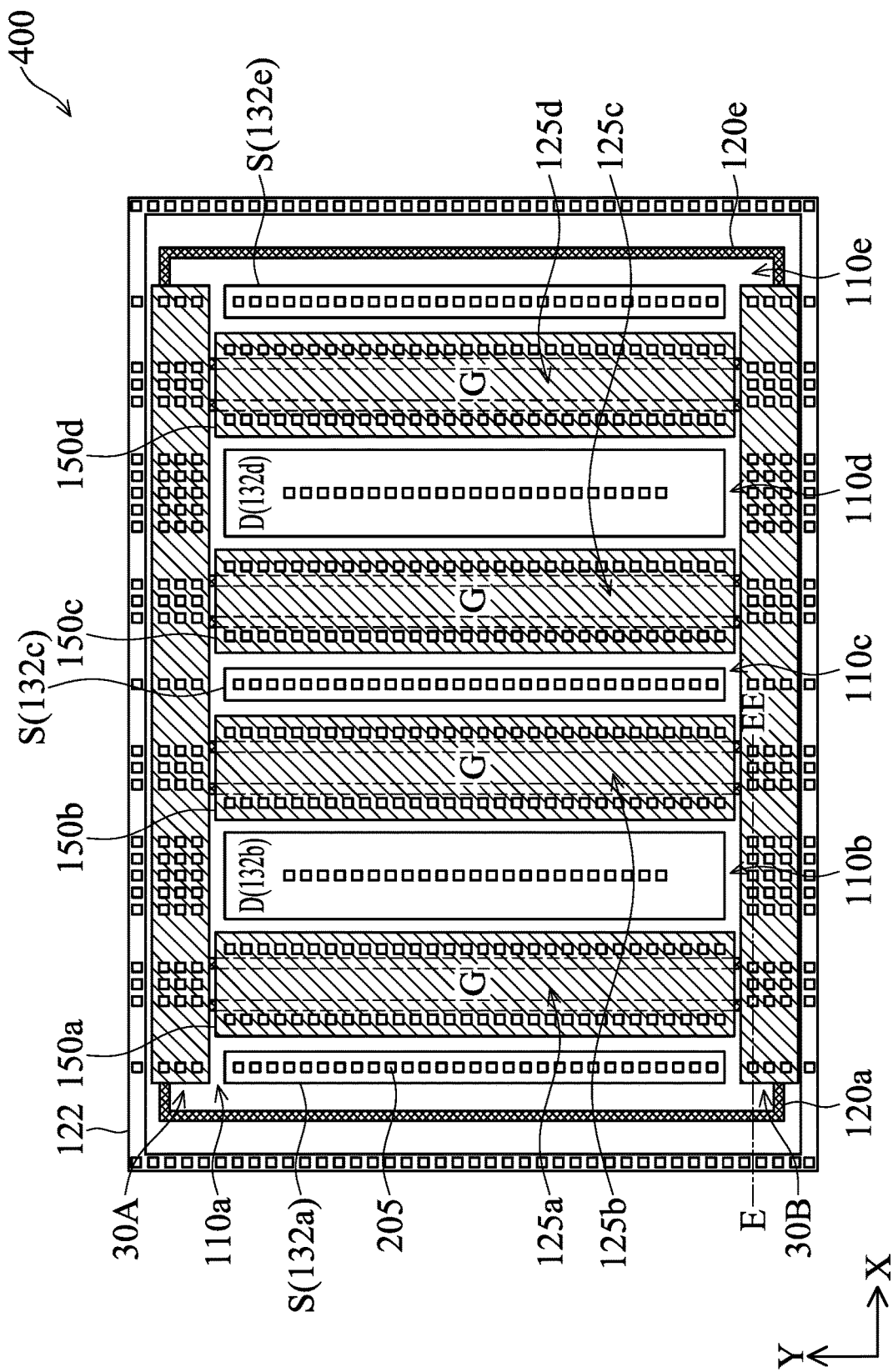
FIG. 8 shows a top view of a semiconductor structure according to some embodiments of the invention.

FIG. 8 shows a top view of a semiconductor structure 400 according to some embodiments of the invention. In some embodiments, the semiconductor structure 400 is an N-type symmetric semiconductor structure. In some embodiments, the semiconductor structure 400 is a high voltage semiconductor structure. The structure of the semiconductor structure 400 is similar to that of the semiconductor structure 300 in FIG. 5. The difference from the semiconductor structure 300 in FIG. 5 is that the semiconductor structure 400 in FIG. 8 includes the shielding structures 30A and 30B. The shielding structure 30A is formed near a first side of the bulk ring 122, and the shielding structure 30B is formed near a second side of the bulk ring 122. The shielding structures 30A and 30B may be electrically coupled to the bulk ring 122 through the contacts 205 and the upper metal plates (e.g., the electrodes 215$a$ and 215$b$ in FIG. 1). In some embodiments, the contacts 205 over the shielding structures 30A and 30B are disposed near the source region S, the drain region D and the gate G. In such embodiment, the shielding structures 30A and 30B extend in the X direction, and the sub-gates 150$a$-150$d$ extend in the Y direction.

The sub-gates 150$a$-150$d$ and the shielding structures 30A and 30B are disposed on the same layer and formed of the same polysilicon material. In some embodiments, the sub-gates 150$a$-150$d$ and the shielding structures 30A and 30B may be formed of the same conductive material. In the X direction, the widths (or dimensions) of the sub-gates 150$a$-150$d$ are smaller than the widths of the shielding structures 30A and 30B. In the Y direction, the lengths (or dimensions) of the sub-gates 150$a$-150$d$ are greater than the lengths of the shielding structures 30A and 30B. In FIG. 8, the shielding structures 30A and 30B extend from the first doped region 132$a$ to the first doped region 132$e$ in the X direction.

Figure 9:
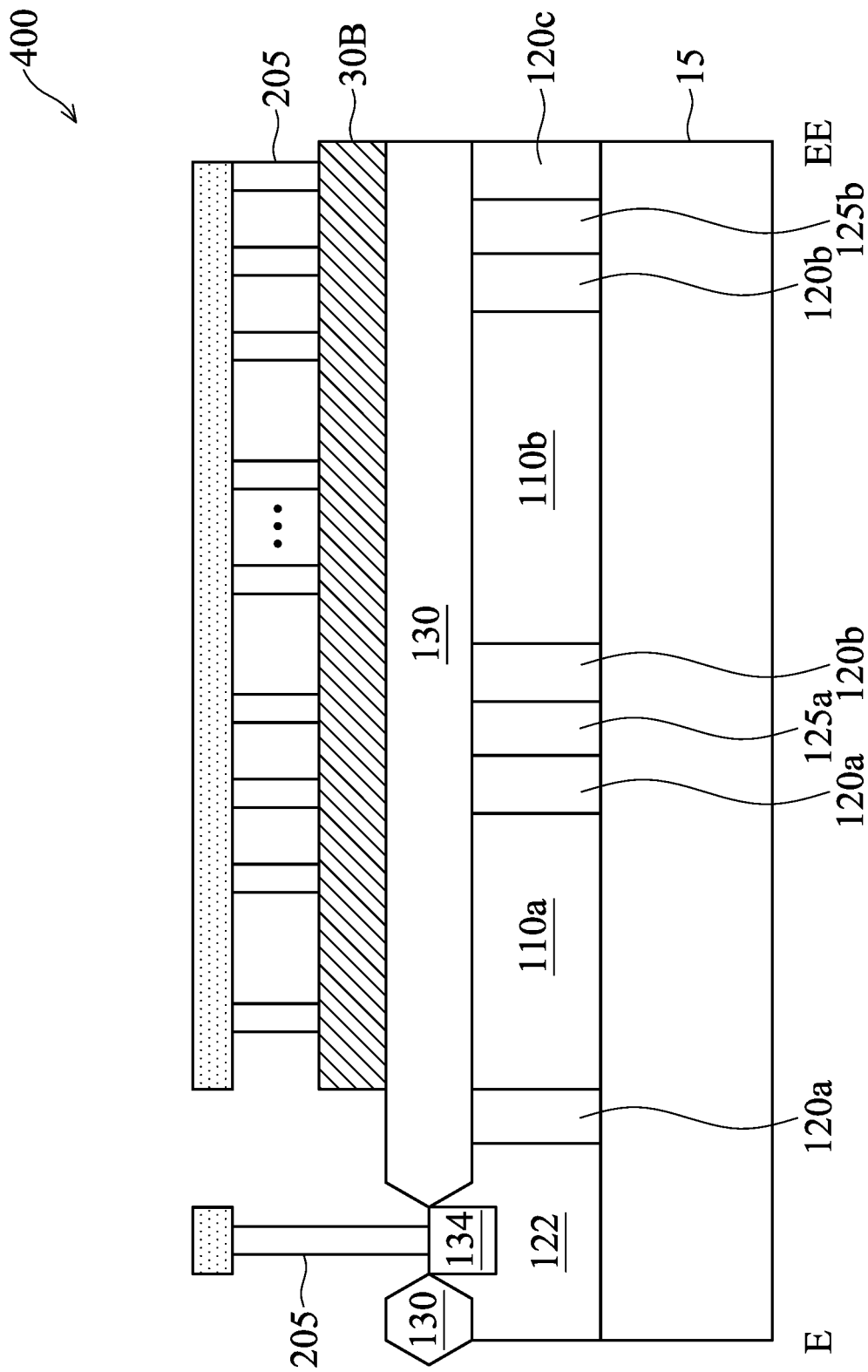
FIG. 9 shows a cross-sectional view of the semiconductor structure in FIG. 8 along the line E-EE according to some embodiments of the invention.

FIG. 9 shows a cross-sectional view of the semiconductor structure 400 in FIG. 8 along the line E-EE according to some embodiments of the invention. The second well region 110$a$ and the third well region 110$b$ and the bulk ring 122 are formed in the semiconductor substrate 15. The shielding structure 30B is formed over the field oxide 130. As previously described, the shielding structure 30B is electrically coupled to the bulk ring 122 through the contacts 205, the upper metal plates and lines, the contacts 205 and the second doped region 134. Thus, when the bulk ring 122 is grounded through the interconnect structure in the semiconductor structure, the shielding structures 30A and 30B are grounded. Therefore, when a metal line formed by a higher metal layer is formed (routed) over the first well regions 125$a$ and 125$b$, the shielding structure 30B can avoid the voltage of the metal line (e.g., the drain voltage to be supplied to the semiconductor structure 400) is coupled to the first well regions 125$a$ and 125$b$. Therefore, the parasitic NPN type bipolar transistor is not turned on, so that the generation of leakage current can be prevented.

Figure 10:
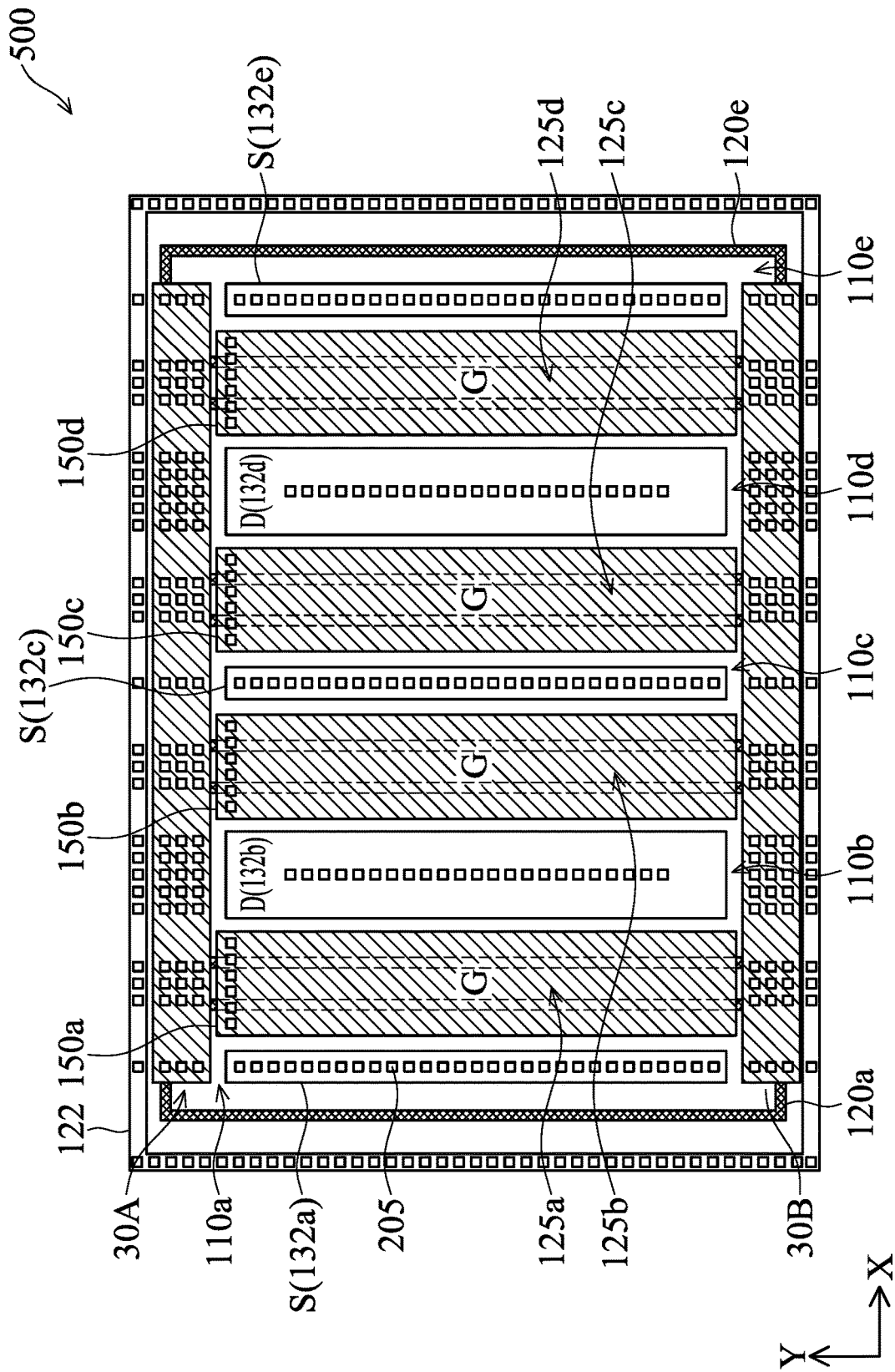
FIG. 10 shows a top view of a semiconductor structure according to some embodiments of the invention.

FIG. 10 shows a top view of a semiconductor structure 500 according to some embodiments of the invention. In some embodiments, the semiconductor structure 500 is an N-type semiconductor structure for electrostatic discharge (ESD) protection. The structure of the semiconductor structure 500 is similar to that of the semiconductor structure 400 of FIG. 8. The difference from the semiconductor structure 500 in FIG. 8 is that the configuration of the contacts 205 of the sub-gates 150$a$-150$d$ of the semiconductor structure 500 in FIG. 10 is different from the configuration of the contacts 205 of the sub-gates 150$a$-150$d$ of the semiconductor structure 400 in FIG. 8. In FIG. 8, each of the sub-gates 150$a$-150$d$ is electrically coupled to the upper electrode (or metal line) through the contacts 205 arranged in a row along the Y direction, so as to receive the gate voltage of gate G applied to the semiconductor structure 400. In FIG. 10, each of the sub-gates 150$a$-150$d$ is electrically coupled to the upper electrode (or metal line) through the contacts 205 arranged in a line along the X direction.

Figure 11:
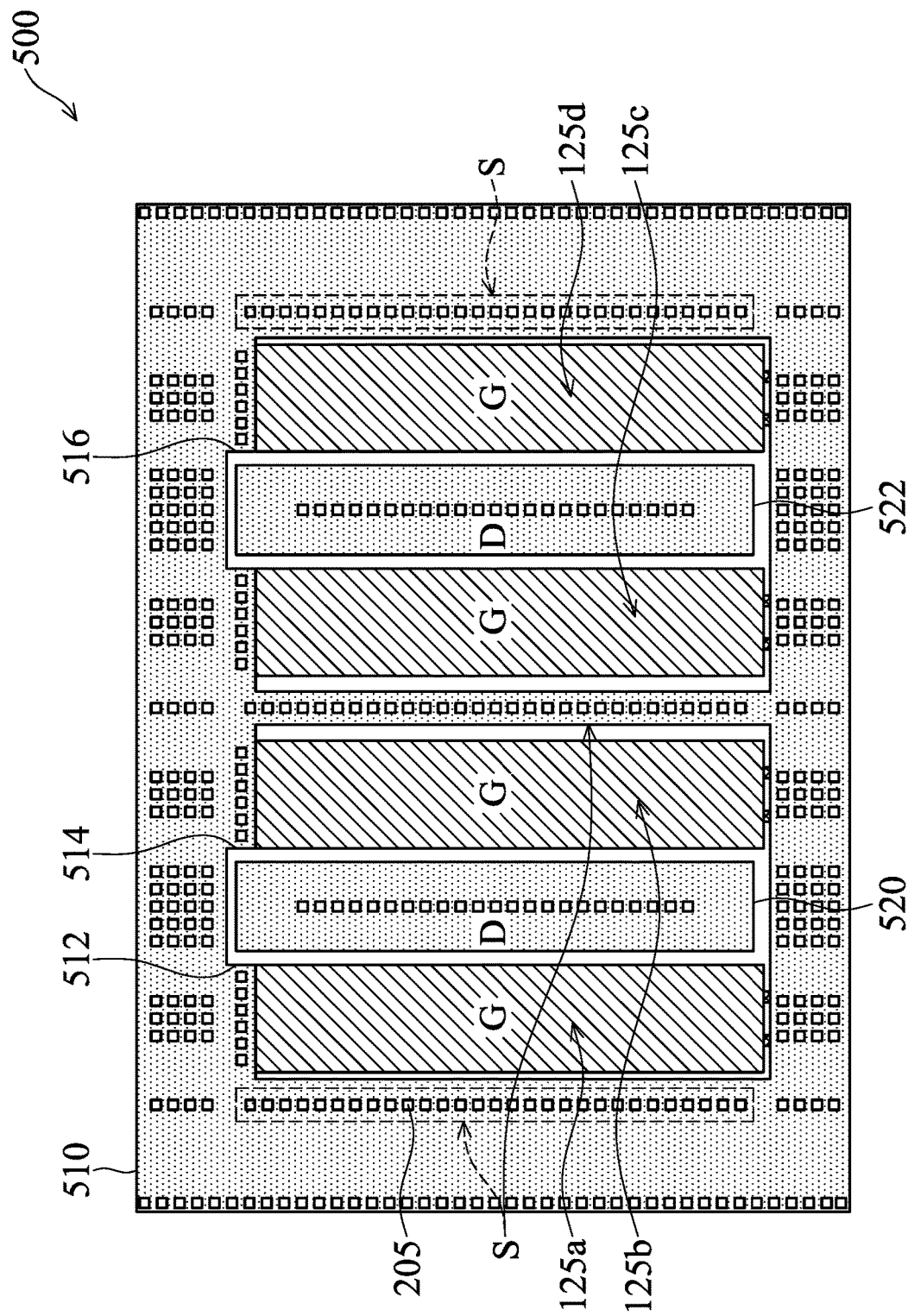
FIG. 11 shows a top view of the semiconductor structure and electrodes of FIG. 10 according to some embodiments of the invention.

FIG. 11 shows a top view of the semiconductor structure 500 and the electrodes 510 of FIG. 10 according to some embodiments of the invention. The electrode 510 is a metal ring formed by a metal line in the lowest metal layer. The electrode 510 overlaps the bulk ring 122 and the first doped regions 132$a$, 132$c$ and 132$e$, and is electrically coupled to the bulk ring 122 and the first doped regions 132$a$, 132$c$ and 132$e$ through the contacts 205. Therefore, the bulk B and the source region S of the semiconductor structure 500 are electrically coupled together through the electrode 510. In addition, the electrode 510 further includes the sub-electrodes 512, 514 and 516 for being electrically coupled to the sub-gates 150$a$-150$d$ through the contacts 205. Thus, the bulk B, the source region S and the gate G of the semiconductor structure 500 are electrically coupled together through the electrode 510.

As described above, the shielding structures 30A and 30B are only formed by the electrodes 510. In other words, the contacts 205 and the polysilicon can be removed in the semiconductor structure 500.

Figure 12:
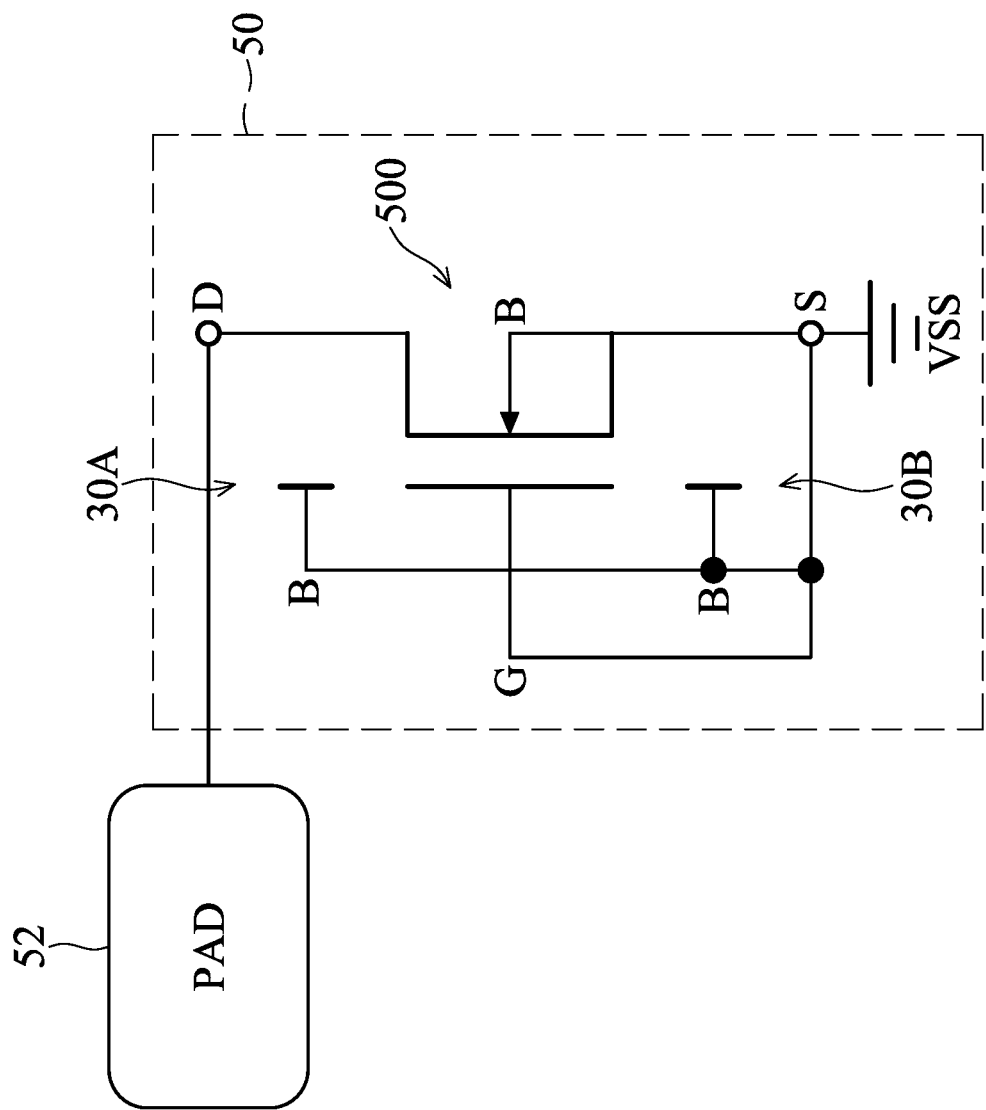
FIG. 12 shows an ESD protection circuit implemented by the semiconductor structure according to some embodiments of the invention.

FIG. 12 shows an ESD protection circuit 50 implemented by the semiconductor structure 500 according to some embodiments of the invention. The ESD protection circuit 50 includes a semiconductor structure 500 including a transistor with two terminals (e.g., the drain region D and the source region S). Referring to FIGS. 10-12 at the same time, the drain region D of the semiconductor structure 500 is electrically coupled to the pad 52 through the metal lines 520 and 522 and other interconnecting structures. The gate G, the bulk B and the source region S of the transistor in the semiconductor structure 500 are electrically coupled to the ground VSS through the electrode 510 and other interconnect structures. As previously described, by using the shielding structures 30A and 30B, ESD energy or higher voltage signals from the pad 52 may not be coupled to the gate G of semiconductor structure 500, so as to avoid turning on parasitic NPN type bipolar transistor, thereby preventing leakage currents.

Figure 13:
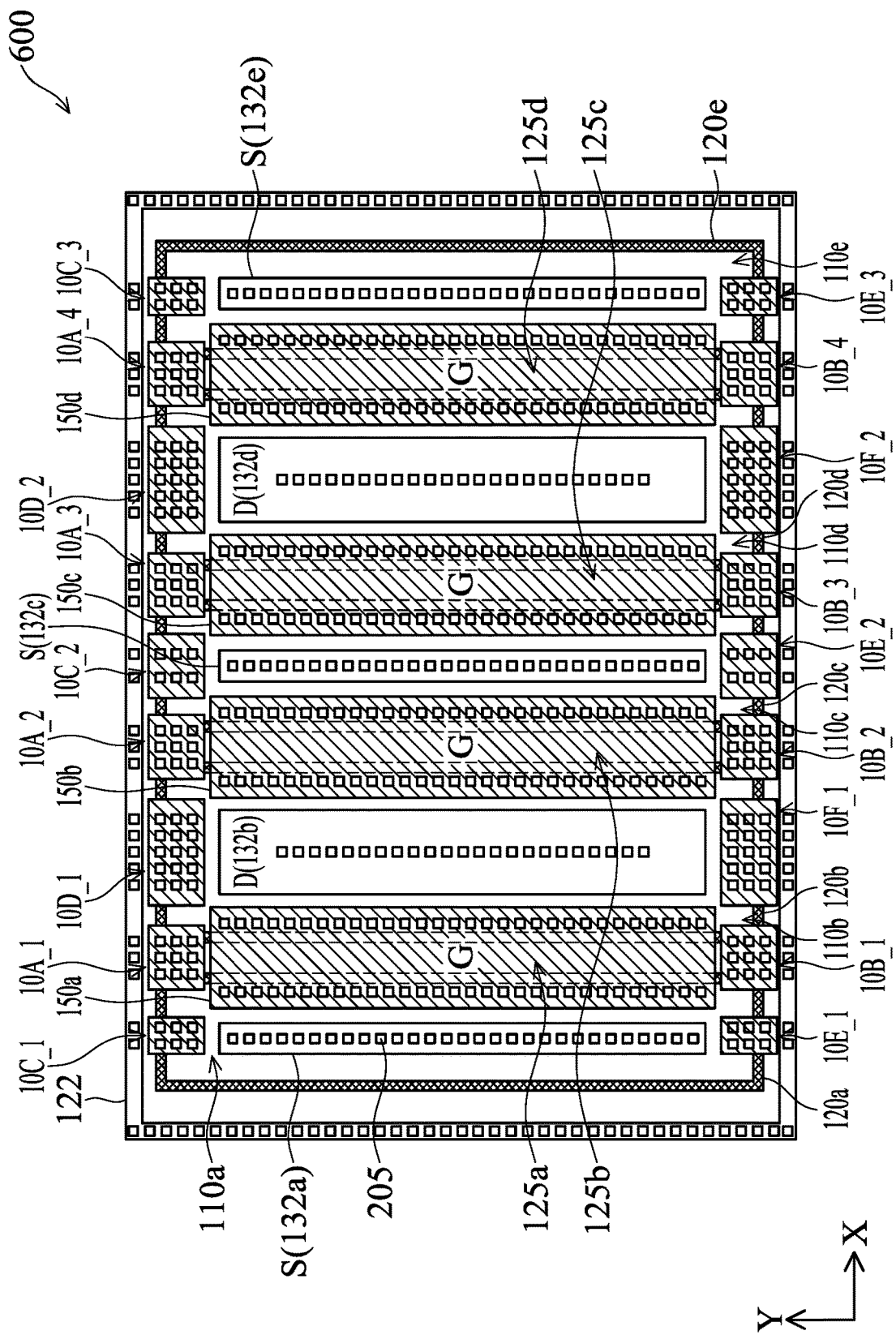
FIG. 13 shows a top view of a semiconductor structure according to some embodiments of the invention.

FIG. 13 shows a top view of a semiconductor structure 600 according to some embodiments of the invention. In some embodiments, the semiconductor structure 600 is an N-type symmetric semiconductor structure. In some embodiments, the semiconductor structure 600 is a high voltage semiconductor structure. The configuration of the semiconductor structure 600 is similar to that of the semiconductor structure 300 of FIG. 5. The difference from the semiconductor structure 300 in FIG. 5 is that the semiconductor structure 600 in FIG. 13 further includes the shielding structures 10C_1-10C_3, the shielding structures 10D_1 and 10D_2, the shielding structures 10E_1-10E_3, and the shielding structures 10F_1 and 10F_2. The shielding structures 10C_1-10C_3 and the shielding structures 10D_1 and 10D_2 are formed near a first side of the bulk ring 122, and the shielding structures 10E_1-10E_3 and the shielding structures 10F_1 and 10F_2 are formed near a second side of the bulk ring 122.

The shielding structures 10C_1-10C_3 and the shielding structures 10D_1-10D_2 are electrically coupled to the first side of the bulk ring 122 through the contacts 205 and an upper metal plate (not shown). The shielding structures 10E_1-10E_3 and the shielding structures 10F_1-10F_2 are electrically coupled to the second side of the bulk ring 122 through the contacts 205 and the upper layer electrodes (not shown).

In FIG. 13, the first doped region 132*a* and the shielding structures 10C_1 and 10E_1 are disposed in the same line along the Y direction. The first doped region 132*b* and the shielding structures 10D_1 and 10F_1 are disposed in the same line along the Y direction. The first doped region 132*c* and the shielding structures 10C_2 and 10E_2 are disposed in the same line along the Y direction. The first doped region 132*d* and the shielding structures 10D_2 and 10F_2 are disposed in the same line along the Y direction. The first doped region 132*e* and the shielding structures 10C_3 and 10E_3 are disposed in the same line along the Y direction.

In the X direction, the widths (or dimensions) of the first doped regions 132*a*, 132*c* and 132*e* are smaller than the widths of the shielding structures 10C_1-10C_3 and the shielding structures 10E_1-10E_3. Furthermore, in the X direction, the widths (or dimensions) of the first doped regions 132*b* and 132*d* are smaller than the widths of the shielding structures 10D_1 and 10D_2 and the shielding structures 10F_1 and F_2.

The shielding structures 10C_1-10C_3, the shielding structures 10D_1-10D_2, the shielding structures 10E_1-10E_3, and the shielding structures 10F_1-10F_2 are electrically coupled to the bulk ring 122 through the contacts 205 and the metal plate of the lowest metal layer. Compared to the continuous shielding structures 30A and 30B of the semiconductor structure 400 in FIG. 8, the upper part of the gaps between the shielding structures 10C_1-10C_3, the shielding structures 10D_1-10D_2, the shielding structures 10E_1-10E_3, and the shielding structures 10F_1-10F_2 can be reserved for the metal lines of the lowest metal layer for routing, thus increasing the flexibility of the layout. Furthermore, as previously described, by adjusting the configuration of the contacts 205, the semiconductor structure 600 can be used as an ESD protected N-type semiconductor structure.

In the embodiments of the invention, by arranging a shielding structure formed of shielding polysilicon between the gate electrode and the bulk ring of the semiconductor structure, the high voltage signal from the upper layer can be prevented from being coupled to the P-type well of the gate. Therefore, the parasitic NPN bipolar transistor can be prevented from being turned on, thereby preventing the generation of leakage current.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
 a semiconductor substrate;
 at least one first well region disposed in the semiconductor substrate and having a first conductivity type;
 at least one gate of a transistor disposed over the at least one first well region and extending lengthwise in a first direction;
 at least one second well region and at least one third well region disposed on opposite sides of the at least one first well region in a second direction and extending lengthwise in the first direction, wherein the second direction is perpendicular to the first direction, and wherein the at least one second well region and the at least one third well region have a second conductivity type, and the second conductivity type is complementary to the first conductivity type;
 a first shielding structure disposed on at least one end of the at least one gate and partially overlapping the at least one first well region in a vertical projection direction, wherein the first shielding structure is separated from the at least one end of the at least one gate in the first direction, and wherein the first shielding structure do not overlap the at least one gate in the vertical projection direction;
 a field oxide disposed between and in direct contact with the at least one first well region and the first shielding structure, wherein the field oxide separates the at least one first well region from the first shielding structure;
 a metal line disposed over the first shielding structure, wherein the first shielding structure is disposed between the field oxide and the metal line;
 a first electrode formed over the first shielding structure;
 a first ring-shaped well region formed in the semiconductor substrate, wherein the at least one second well region is surrounded by and in direct contact with the first ring-shaped well region;
 a second ring-shaped well region formed in the semiconductor substrate, wherein the at least one third well region is surrounded by and in direct contact with the second ring-shaped well region, wherein the first ring-shaped well region and the second ring-shaped well region have the first conductivity type; and
 a bulk ring disposed in the semiconductor substrate and surrounding the at least one gate, the at least one second well region, the at least one third well region, the first shielding structure, the first ring-shaped well region, and the second ring-shaped well region, wherein the bulk ring has the first conductivity type, and wherein the first shielding structure is electrically coupled to the bulk ring through the first electrode and electrically connected to a ground,
 wherein each of the first ring-shaped well region and the second ring-shaped well region is closed ring-shaped, and the first ring-shaped well region is separated from the second ring-shaped well region by the at least one first well region,
 wherein the first shielding structure partially overlaps the first ring-shaped well region and the second ring-shaped well region in the vertical projection direction,
 wherein the field oxide overlaps the at least one second well region, the at least one third well region, the first ring-shaped well region, and the second ring-shaped well region in the vertical projection direction, wherein bottom surfaces of the at least one first well region, the at least one second well region, the at least one third well region, the bulk ring, the first ring-shaped well region, and the second ring-shaped well region are coplanar.

2. The semiconductor structure as claimed in claim 1, further comprising:
at least one source and drain of the transistor disposed over the at least one second well region and extending lengthwise in the first direction, wherein the first shielding structure is disposed on at least one end of the at least one source and drain.

3. The semiconductor structure as claimed in claim 1, further comprising:
a second shielding structure disposed between the other end of the at least one gate and the bulk ring and partially overlapping the at least one first well region in the vertical projection direction.

4. The semiconductor structure as claimed in claim 1, wherein the at least one second well region and the at least one third well region are a source region and a drain region of the transistor, and the first shielding structure partially overlaps the at least one second well region and the at least one third well region.

5. The semiconductor structure as claimed in claim 1, wherein a plurality of gates, a plurality of first well regions, a plurality of second well regions and a plurality of third well regions extend in the first direction, and the gates, the second well regions, and the third well regions are alternately arranged in the second direction.

6. The semiconductor structure as claimed in claim 5, wherein the second well regions and the third well regions are source region and drain region of the transistor.

7. The semiconductor structure as claimed in claim 1, further comprising:
a first interconnect structure formed over the semiconductor substrate;
a pad formed over the semiconductor substrate, wherein the pad is electrically coupled to a drain region of the transistor through the first interconnect structure; and
a second interconnect structure formed over the semiconductor substrate;
wherein the at least one gate, a source region of the transistor, the bulk ring and the first shielding structure are electrically connected to a ground through the second interconnect structure.

8. The semiconductor structure as claimed in claim 1, further comprising:
a third shielding structure formed over the semiconductor substrate,
wherein the third shielding structure is disposed between the at least one second well region and the bulk ring, wherein the first shielding structure and the third shielding structure are disposed on the same side of the at least one gate.

9. The semiconductor structure as claimed in claim 8, wherein the first shielding structure is electrically connected to the third shielding structure.

10. The semiconductor structure as claimed in claim 1, further comprising:
a fourth shielding structure formed over the semiconductor substrate,
wherein the fourth shielding structure is disposed between the at least one third well region and the bulk ring, wherein the first shielding structure and the fourth shielding structure are disposed on the same side of the at least one gate.

11. The semiconductor structure as claimed in claim 10, wherein the first shielding structure is electrically connected to the fourth shielding structure.

12. The semiconductor structure as claimed in claim 1, wherein a length of the at least one gate is greater than a length of the first shielding structure in the first direction, and a width of the at least one gate is greater than a width of the first shielding structure in a the second direction.

13. The semiconductor structure as claimed in claim 5, further comprising:
a plurality of first ring-shaped well regions formed in the semiconductor substrate, wherein each of the second well regions is surrounded by respective first ring-shaped well region; and
a plurality of second ring-shaped well regions formed in the semiconductor substrate, wherein each of the third well regions is surrounded by the respective second ring-shaped well region,
wherein the first ring-shaped well regions and the second ring-shaped well regions have the first conductivity type.

14. The semiconductor structure as claimed in claim 13, wherein each of the first well regions is formed between one of the first ring-shaped well regions and one of the second ring-shaped well regions.

15. The semiconductor structure as claimed in claim 1, wherein the first shielding structure is formed by polysilicon.

16. The semiconductor structure as claimed in claim 1, wherein the first shielding structure is formed by an electrode in the lowest metal layer.

17. The semiconductor structure as claimed in claim 16, wherein the electrode is electrically coupled to the bulk ring through a plurality of contacts and electrically connected to a ground.

* * * * *